United States Patent
Haigh, Jr. et al.

(10) Patent No.: US 9,735,005 B1
(45) Date of Patent: Aug. 15, 2017

(54) ROBUST HIGH PERFORMANCE LOW HYDROGEN SILICON CARBON NITRIDE (SICNH) DIELECTRICS FOR NANO ELECTRONIC DEVICES

(71) Applicant: INTERNATIONAL BUSINESS MACHINES CORPORATION, Armonk, NY (US)

(72) Inventors: Thomas J. Haigh, Jr., Claverack, NY (US); Son V. Nguyen, Schenectady, NY (US); Deepika Priyadarshini, Guilderland, NY (US); Hosadurga Shobha, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/067,996

(22) Filed: Mar. 11, 2016

(51) Int. Cl.
H01L 21/00 (2006.01)
H01L 21/02 (2006.01)

(52) U.S. Cl.
CPC .. H01L 21/02126 (2013.01); H01L 21/02274 (2013.01)

(58) Field of Classification Search
CPC ................. H01L 21/02126; H01L 21/02274
See application file for complete search history.

(56) References Cited

U.S. PATENT DOCUMENTS

| 4,863,755 | A | 9/1989 | Hess et al. |
| 7,847,402 | B2 | 12/2010 | Restaino et al. |
| 8,242,028 | B1 | 8/2012 | van Schravendijk et al. |
| 2008/0009141 | A1 | 1/2008 | Dubois et al. |
| 2009/0039475 | A1 | 2/2009 | Shioya |
| 2011/0064932 | A1 | 3/2011 | Takahashi et al. |
| 2013/0183835 | A1 | 7/2013 | Nguyen et al. |
| 2015/0021599 | A1* | 1/2015 | Ridgeway ............. C23C 16/345 257/43 |
| 2015/0287593 | A1 | 10/2015 | Canaperi et al. |

OTHER PUBLICATIONS

Ay, F. et al., "Comparative investigation of hydrogen bonding in silicon based PECVD grown dielectrics for optical waveguides" Optical Materials (2004) pp. 33-46, vol. 26.

Martin, J. et al., "Integration of SiCN as a Low k Etch Stop and Cu Passivation in a High Performance Cu/Low k Interconnect" Proceedings of the IEEE 2002 International Interconnect Technology Conference (2002) pp. 42-44.

(Continued)

*Primary Examiner* — Laura Menz
(74) *Attorney, Agent, or Firm* — Tutunjian & Bitetto, P.C.; Vazken Alexanian

(57) ABSTRACT

A method for depositing a dielectric layer that includes introducing a substrate into a process chamber of a deposition tool; and heating the substrate to a process temperature. The method may further include introducing precursors that include at least one dielectric providing gas species for a deposited layer and at least one hydrogen precursor gas into the process chamber of the deposition tool. The hydrogen precursor gas is introduced to the deposition chamber at a flow rate ranging from 50 sccm to 5000 sccm. The molar ratio for Hydrogen/Silicon gas precursor can be equal or greater than 0.05.

9 Claims, 6 Drawing Sheets

(56) References Cited

OTHER PUBLICATIONS

Fainer, N.I. et al., "Synthesis of Silicon Carbonitride Layers Using Methyltris(diethylamino)silane as the New Single-Source Precursor" ECS Journal of Solid State Science and technology (Jan. 2015) pp. N3153-N3163, vol. 4, No. 1.

Nguyen, S.V. et al., "Ultrathin (5-35 nm) SiCNH dielectrics for damascene Cu cap application: Thickness scaling and oxidation barrier performance limitation" ECS Transactions (2010) pp. 1, abstract # 1685.

\* cited by examiner

ROBUST HIGH PERFORMANCE LOW HYDROGEN SILICON CARBON NITRIDE (SICNH) DIELECTRICS FOR NANO ELECTRONIC DEVICES

BACKGROUND

Technical Field

The present disclosure relates to semiconductor manufacturing, and more particularly to low hydrogen dielectrics that can be used in semiconductor manufacturing.

Description of the Related Art

Silicon-based integrated circuits (IC)s have been fabricated using a silicon dielectric, such as silicon oxide. These films are heretofore formed using various hydrogen-bearing precursors. These hydrogen-bearing precursors, are mostly in gas or liquid form and are widely used due to their ease of implementation into a chemical vapor deposition (CVD) process or plasma enhanced CVD (PECVD). As a result, most of these dielectrics used in front end of the line and back end of the line silicon integrated circuit fabrication have a significant amount of weakly bonded hydrogen.

SUMMARY

In one aspect of the present disclosure, a method of depositing a dielectric film is provided that produces a silicon containing dielectric having a low hydrogen content. In one embodiment, the method may include introducing a substrate into a chamber of a deposition tool, and heating the substrate to a process temperature. The method may further include introducing precursors that include at least one dielectric providing gas species for the deposited layer and at least one hydrogen precursor gas, wherein the hydrogen precursor gas is introduced to the deposition chamber in an amount ranging from 50 sccm to 5000 sccm. The method may further include activating a plasma in the chamber.

In another embodiment, the method for depositing a dielectric film may include introducing a substrate into a chamber of a deposition tool; and heating the substrate to a process temperature. The method may further include introducing precursors that include at least one dielectric providing gas species for the deposited layer, and introducing a hydrogen precursor gas at a flow rate greater than 50 sccm. In some embodiments, a plasma may be activated in the process chamber to deposit a dielectric material comprised of at least one of silicon, carbon, nitrogen and hydrogen. The greater the flow of the hydrogen precursor the lower the hydrogen incorporation in the dielectric material being deposited. The molar ratio for Hydrogen/Silicon base precursor should be equal or greater than 0.05

In yet another aspect of the present disclosure, a semiconductor device is provided that includes a dielectric comprising of silicon (Si), carbon (C), nitrogen (N) and hydrogen (H). In one embodiment, the dielectric film includes silicon in an amount ranging from 25 at. % to 35 at. %; carbon in an amount ranging from 15 at. % to 25 at. %; nitrogen in an amount ranging from 10 at. % to 25 at. %; and hydrogen in an amount of 30 at. % or less. The dielectric film when treated with an ultraviolet curing process for a temperature ranging from 350° C. to 400° C. for a time period ranging from 500 seconds to 600 seconds has a shrinkage that is less than 4.5%. In some embodiments, the dielectric film is a layer within a spacer, cap structure, liner layer, oxidation barrier, passivation barrier, or etch stop layer of a nano electrical device.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
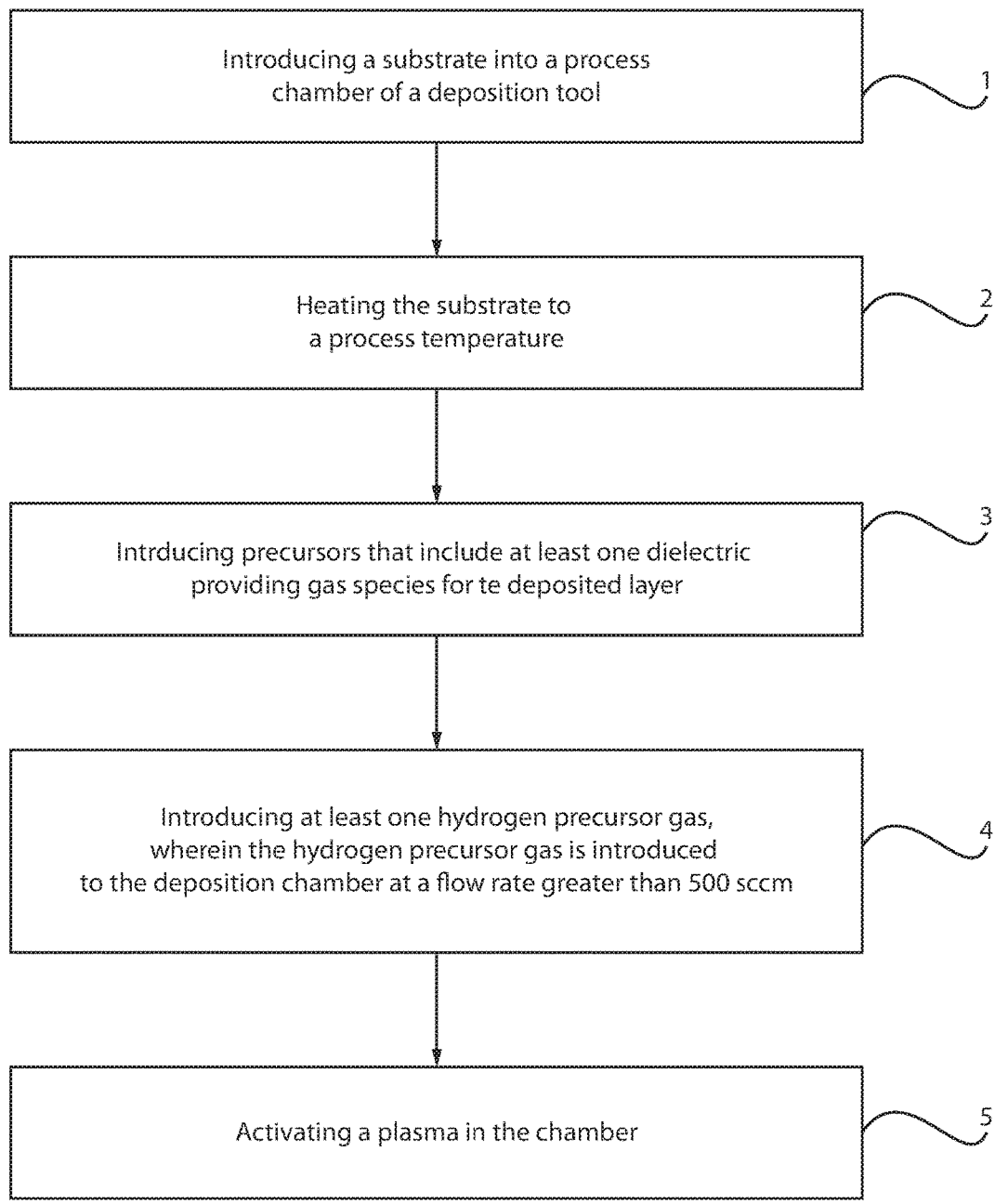
FIG. 1 is a flow chart describing one embodiment of a method for depositing a dielectric film having a low hydrogen content, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "present on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

Silicon-based integrated circuits (IC)s are typically fabricated using a silicon dielectric such as silicon nitride, silicon carbon nitride, silicon carbon oxygen nitride and silicon oxide. These films are heretofore formed using various hydrogen-bearing precursors. These hydrogen-bearing precursors, are mostly in gas or liquid form and are widely used due to their ease of implementation into a chemical vapor deposition (CVD) process or a plasma enhanced CVD (PECVD) process. As a result, most of these dielectrics used in FEOL (front end of line) and BEOL (back end of line) silicon integrated circuit fabrication have a significant amount of weakly bonded hydrogen, which has been determined to result in a negative reliability impact to electronic devices. Furthermore, UV and E-Beam processing that have been recently implemented semiconductor devices can break the weak hydrogen bonds and release hydrogen atoms, and subsequently cause reliability issues.

In some scenarios it can be desirable to have improvements in dielectric films to mitigate the aforementioned problems by reducing the amount of hydrogen in the dielectric film. For example, High Density Plasma CVD (HDP-CVD) processing of silicon nitride film has been used to reduce the amount of hydrogen in the silicon nitride film to mitigate the Vt shift problem in electronic device caused by the amount of hydrogen in the silicon nitride film. However, it has been determined that the plasma high RF power High Density Plasma deposition process tends to cause significant charging and ion bombardment in the deposited surface, which can cause significant damage to the nanoelectronic devices, and the deposited film's surface. In other examples, high RF power cap dielectric materials, such as SiCNH, also tend to have a significant amount of Hydrogen. It has been determined, that upon exposure to UV radiation during ultra low-k dielectric (ULK) cure, an underlayer of SiCNH film can releases a significant amount of weakly bond hydrogen and convert the ultra low-k dielectric from a compressive state to a tensile state. Subsequently, this can have negative impact on device reliability such as ULK/cap film's stack cracking and unwanted hydrogen diffusion.

In some embodiments, the methods, systems and structures that are disclosed herein provide a new deposition process and low hydrogen silicon containing dielectric film deposited with stable conventional process that is suitable for microelectronic and nanoelectronic devices. The low hydrogen silicon containing dielectric film may be composed of silicon, nitrogen, carbon and hydrogen. For example, the low hydrogen silicon containing dielectric may be composed of silicon, carbon, nitride (SiCNH) dielectric. The term "low hydrogen" denotes a hydrogen content in the silicon containing dielectric film that may equal to about 30 wt. % or less. For example, in some embodiments, the maximum hydrogen content in the silicon containing dielectrics disclosed herein, i.e., formed by the method disclosed herein, may have a maximum hydrogen content ranging of at least 25%, 20%, 15%, 10%, 5%, 4%, 3%, 2%, 1%, or less by weight.

In some embodiments, the low hydrogen (H) content silicon containing dielectrics that are disclosed herein are more stable under UV cure than typical dielectric materials, such as silicon nitride and silicon oxide, having conventional levels of hydrogen. The hydrogen that is incorporated into prior silicon containing dielectrics, such as SiCNH, can result in producing a tensile strain when subjected to ultraviolet light, such as in the application of UV curing processes. This stress can impact the mechanical properties of the dielectric material, which can further impact their suitability for semiconductor device processing as the required thickness of dielectrics having this composition is reduced to less than 15 nm.

The low hydrogen (H) content silicon containing dielectric that is disclosed herein mostly retains a SiCN composition that is provided by conventional deposition methods, but the low hydrogen (H) content silicon has less carbon to hydrogen (C—H) bonding. The reduced carbon to hydrogen (C—H) bonding that is present in the low hydrogen (H) silicon containing dielectrics, e.g., low hydrogen SiCNH, that are produced by the present disclosure results from using hydrogen as one of the reactant precursors. Normally, it is believed that in order to generate a deposited film using chemical vapor deposition (CVD) with less hydrogen (H), the initial reactants should not contain a large amount of hydrogen that can be incorporated into the film. In accordance with some embodiments of the present disclosure, it has been discovered that by increasing the hydrogen (H) content of the precursors, that the methods disclosed herein unexpectedly reduce the hydrogen content in the deposited material. This is different than what is expected, and how the state of the art has attempted to reduce hydrogen incorporation into dielectrics by removing hydrogen from the precursors or employing precursors that do not include hydrogen, i.e., hydrogen less precursors. In some embodiments, the methods disclosed herein increase hydrogen in the precursors for depositing a SiCNH, which results in a low hydrogen content, yet can actually increase the carbon (C) content in the film. As will be discussed in greater detail below, in some embodiments, the hydrogen incorporation into the precursors can actually increase the Si—C and Si—N bonding in the film itself. Therefore, in some embodiments, by increasing the Si—C and Si—N bonding in the film itself, the methods disclosed herein can provide a low hydrogen (H) silicon containing dielectric, in which the film's bonding density and stability under UV cure are improved. For example, as will be discussed in greater detail below, a SiCNH film produced using the methods disclosed herein may increase the density from approximately 2.0 grm/cm$^3$, which is a value produced without a significant hydrogen precursor source to greater than 2.5 grm/cm$^3$ when a hydrogen precursor source, i.e., H$_2$ gas, is introduced to the deposition chamber with the gas precursors in an amount ranging from 1000 sccm to 5000 sccm. For example, as will be discussed in greater detail below, a SiCNH film produced using the methods disclosed herein may decrease shrinkage of a SiCNH film from 5%, i.e., the typical shrinkage for a dielectric formed without the disclosed high hydrogen precursor method, to as low as about 1.0% in response to a UV cure when the silicon containing dielectric is formed using a hydrogen precursor source, i.e., H$_2$ gas, in an amount ranging from 1000 sccm to 5000 sccm.

The low hydrogen silicon containing dielectrics, such as SiCNH dielectrics, that are disclosed herein can be used as a cap dielectric material, low-k spacer material, liner material, etch stop materials, and hardmasks in the production of semiconductor device, and within final semiconductor structures. In some embodiments, the increase in mechanical properties provided by the decreased hydrogen content in the deposited SiCNH dielectric provided by the disclosed hydrogen precursor including deposition process provides a significant mechanical improvement in semiconductor material layers having a thickness of 15 nm or less. e.g., in semiconductor material layers having a thickness of 10 nm or less. This provides that the disclosed low hydrogen silicon containing dielectrics are in some embodiments suitable for material layers in cap dielectric materials, low-k spacer materials, liner materials, etch stop materials, and hardmasks. Some embodiments of the methods and structures disclosed herein, are now described in more detail with reference to FIGS. 1-6.

Figure 2:
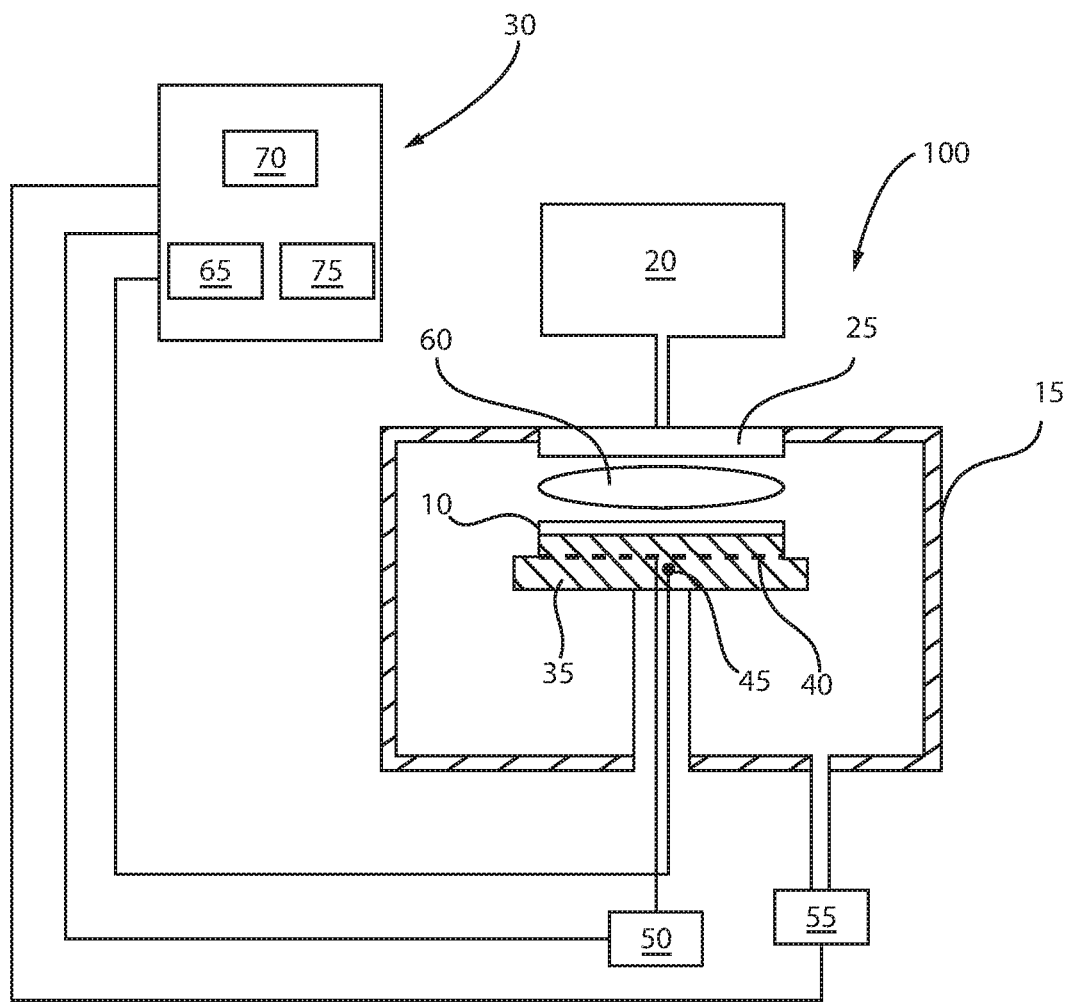
FIG. 2 is a schematic of a deposition apparatus for depositing a dielectric film having a low hydrogen content, in accordance with one embodiment of the present disclosure.

FIGS. 1 and 2 describes one embodiment of a method for depositing a dielectric film that produces a silicon dielectric having a low hydrogen content. In some embodiments, the method may be achieved by processes utilizing a processing gas mixture introduced into a processing chamber, where the processing gas mixture includes precursors having at least silicon, nitrogen and carbon, and in some embodiments, the precursor gas compounds have combinations of silicon, nitrogen and silicon. The precursor gases have labile silicon to nitrogen, silicon to carbon, or nitrogen to carbon bonds. The precursor gases are activated, at least partially, to form a limited number of active or reaction sites along the precursor gas compound by preferentially breaking the labile bonds. The active site of the precursor gas bonds with a surface on the substrate to form a precursor material layer on the substrate. A plasma treatment process is then performed on the precursor material layer to form a low hydrogen silicon containing dielectric layer, e.g., a low hydrogen SiCNH layer.

According to an embodiment, a low hydrogen silicon containing dielectric layer is formed using a deposition cycle having various processes. The method may begin at step 1 of the method illustrated by the flow diagram illustrated in FIG. 1 with positioning a substrate 10 within a process chamber 15 of a deposition apparatus 100, such as a chemical vapor deposition (CVD) apparatus. Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Variations of CVD processes include, but not limited to. Atmospheric Pressure CVD (APCVD). Low Pressure CVD (LPCVD) and Plasma Enhanced CVD (PECVD), Metal-Organic CVD (MOCVD) and combinations thereof may also be employed. Although the present disclosure may further refer to the PECVD method, the methods disclosed herein may be suitable for any type of CVD.

In some embodiments, the system 100 may include a process chamber 15, a gas panel 20, a shower head 25, a control unit 30, and other hardware components such as power supplies and vacuum pumps. The process chamber 15 generally comprises a substrate support pedestal 35, which is used to support a substrate 10.

The substrate 10 that provides the deposition surface may be composed of any material, such as a semiconductor material, a dielectric material or a metal material. In some embodiments, in which the low hydrogen silicon containing dielectric is being deposited to serve as a cap dielectric material, low-k spacer material, liner material, etch stop materials, and/or hardmask, the substrate 10 may include semiconductor devices, memory devices, or passive electrical devices, or partially formed semiconductor devices, memory devices, or passive electrical devices including components, such as gate structures, source regions, drain regions, fin structures, mandrel structures, interconnects, vias, contact regions, metal lines, isolation regions, and combinations thereof.

Referring to FIG. 1, in some embodiments, once the substrate 10 is within the process chamber 15, the substrate 10 may be heated to a process temperature at step 2. Referring to FIG. 2, the substrate support pedestal 35 may be heated by an embedded heater element 40. For example, the substrate support pedestal 35 may be resistively heated by applying an electric current from a power supply 50 to the heater element 40. The substrate 10 is, in turn, heated by the substrate support pedestal 35. A temperature sensor 45, such as a thermocouple, is also embedded in the substrate support pedestal 35 to monitor the temperature of the substrate support pedestal 35. The measured temperature is used in a feedback loop to control the power supply 50 for the heater element 40. The temperature of the substrate 10 can be maintained or controlled at a temperature that is selected for the particular process application. In some embodiment, the process temperature for forming the low hydrogen silicon containing dielectric may range from 20° C. to 900° C. For example, the temperature may be less than 300° C., such as from about 50° C. to about 500° C. In another example, the temperature range for depositing a low hydrogen silicon containing dielectric, such as low hydrogen SiCNH may range from about 100° C. to 400° C. In yet another example, the temperature range for depositing the low hydrogen silicon containing dielectric ranges from 300° C. to 350° C.

Referring to FIG. 1, in a following step of the method, the deposition cycle continues with flowing a processing gas mixture into the processing chamber 15 having the substrate 10 therein at steps 3 and 4. In some embodiments, the processing gas mixture may include introducing precursors that include at least one dielectric providing gas species for the deposited layer (as described in step 3 of FIG. 1), and at least one hydrogen precursor gas (as described in step 4 of FIG. 1). In some embodiments, the hydrogen precursor gas is introduced to the process chamber in an amount ranging from 50 sccm to 5000 sccm, and in some examples greater than 500 sccm. It is noted that although FIG. 1 illustrates a sequence in which the order of the gas precursors starts with the at least one dielectric providing gas species followed by the at least one hydrogen precursor gas, the present method is not limited to only this example. For example, the method may employ a gas precursor sequence that starts with the at least one hydrogen precursor gas being introduced to the processing chamber 15 before the at least one dielectric providing gas species; and the method may employ a process sequence that introduces the at least one hydrogen precursor gas and the at least one dielectric providing gas substantially simultaneously to the process chamber 15.

Referring to FIG. 2, in some embodiments, a vacuum pump 55 is used to evacuate the process chamber 15 and to maintain the proper gas flows and pressure inside the process chamber 15. A showerhead 25, through which process gases are introduced into process chamber 15, is located above the substrate support pedestal 35 and is adapted to provide a uniform distribution of process gases into process chamber 15. The showerhead 25 is connected to a gas panel 20, which controls and supplies the various process gases used, i.e., the at least one hydrogen precursor gas and the at least one dielectric providing gas, in different steps of the process sequence.

The gas panel 20 may also be used to control and supply various vaporized liquid precursors. While not shown, liquid precursors from a liquid precursor supply may be vaporized, for example, by a liquid injection vaporizer, and delivered to process chamber 15 in the presence of a carrier gas. The carrier gas is typically an inert gas, such as nitrogen, or a noble gas, such as argon or helium. Alternatively, the liquid precursor may be vaporized from an ampoule by a thermal and/or vacuum enhanced vaporization process.

Proper control and regulation of the gas and liquid flows through the gas panel 20 is performed by mass flow controllers (not shown) and a control unit 30 such as a computer. The showerhead 25 allows process gases from the gas panel 20 to be uniformly distributed and introduced into the process chamber 15. Illustratively, the control unit 30 comprises a central processing unit (CPU) 60, support circuitry 65, and memories containing associated control software 70. This control unit 30 is responsible for automated control of the numerous steps required for substrate processing, such as substrate transport, gas flow control, liquid flow control, temperature control, chamber evacuation, and other related processes for the deposition apparatus 100.

The at least one dielectric providing gas species are the gas precursors including elements that are incorporated into the deposited low hydrogen (H) silicon containing dielectric. In the embodiments, in which the low hydrogen (H) silicon containing dielectric is low hydrogen (H) SiCNH, the at least one dielectric providing gas species may include at least one of a silicon containing precursor, a carbon containing precursor and a nitrogen containing precursor. It is noted that the silicon, carbon and nitrogen may be provided by a single precursor gas, or multiple precursor gasses. For example, the silicon containing precursor may provide both silicon (Si) and carbon (C) to the deposited material, i.e., the low hydrogen (H) silicon containing dielectric. The at least one dielectric providing gas species may be a precursor that may comprise compounds having labile silicon to nitrogen, silicon to carbon, or nitrogen to carbon bonds. The precursors may also include hydrocarbon groups, such as methyl and ethyl groups. Some examples of suitable precursors include trimethyl silane or tetramethyl silane with $NH_3$ and hydrogen. Some other examples of suitable precursors include substituted silazanes, substituted silanes, or combinations thereof. Substituted silazanes are compounds having a Si—N backbone and various organic substitutions on the Si, such as alkyl groups. Substituted silanes are compounds having a Si—N backbone with various organic substitutions on N. The organic substitutions along these molecules tend to be the labile group(s) in these compounds, whose labile bonds are broken during activation of the precursor gas or gases. The substituted silazanes may be cyclic or linear. Suitable cyclic silazanes include one or more of the following compounds, for example tetramethylcyclotetrasilazanes, hexamethylcyclotetrasilazanes (HMCTZ), and octamethylcyclotetrasilazanes, or combinations thereof. Some specific examples of cyclic silazanes include 1,2,3,4 tetramethylcyclotetrasilazane, 1,1,3,3 tetramethylcyclotetrasilazane, 1,1,3,3,5,5 hexamethylcyclotetrasilazane, 1,2,3,4,5,6 hexamethylcyclotetrasilazane, 1,1,3,3,5,5,7,7 octamethylcyclotetrasilazen, and 1,2,3,4,5,6,7,8 octamethylcyclotetrasilazane. Suitable linear silazanes include hexamethyldisilazane (HMDS). Suitable substituted silanes may include bis-diethylamine silane (BDEAS), bis(tertiary-butylamino)silane (BTBAS), and tris(dimethylamino)silane (TDMAS). Any of the precursor compounds may be used alone or in combination with other precursor compounds.

The silicon containing precursor may include silicon, the silicon gas source for epitaxial deposition may be selected from the group consisting of hexachlorodisilane ($Si_2Cl_6$), tetrachlorosilane ($SiCl_4$), dichlorosilane ($Cl_2SiH_2$), trichlorosilane ($Cl_3SiH$), methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), hexamethyldisilane (($CH_3$)$_6Si_2$) and combinations thereof. The silicon containing precursor may have a flow rate within a range from about 50 sccm to about 2,000 sccm, preferably, from about 100 sccm to about 1.500 sccm. In various examples, the silicon containing precursor may have a flow rate of about 100 sccm, 500 sccm, 1,000 sccm or 1,500 sccm.

The carbon containing precursor comprises at least one of methylsilane ($CH_3SiH_3$), dimethylsilane (($CH_3$)$_2SiH_2$), trimethyl silane (($CH_3$)$_3SiH$), tetramethyl silane (($CH_3$)$_4Si$), ethylsilane ($CH_3CH_2SiH_3$), methane ($CH_4$), ethylene ($C_2H_4$), ethyne ($C_2H_2$), propane ($C_3H_8$), propene ($C_3H_6$), butyne ($C_4H_6$), and combinations thereof. The carbon containing precursor may have a flow rate within a range from about 50 sccm to about 2,000 sccm, preferably, from about 100 sccm to about 1,500 sccm. In various examples, the carbon containing precursor may have a flow rate of about 100 sccm, 500 sccm, 1,000 sccm or 1,500 sccm.

The nitrogen-containing gas may be used to deposit tantalum-containing materials, such as tantalum carbide nitride materials. A nitrogen-containing gas like Nitrogen ($N_2$) or nitrogen precursor may include, ammonia ($NH_3$), hydrazine ($N_2H_4$), methyl hydrazine (($CH_3$)$HN_2H_2$), dimethyl hydrazine (($CH_3$)$_2N_2H_2$), t-butylhydrazine ($C_4H_9N_2H_3$), phenylhydrazine ($C_6H_5N_2H_3$), other hydrazine derivatives, amines, a nitrogen plasma source (e.g., $N_2$, $N_2/H_2$, $NH_3$, or $N_2H_4$ plasmas), 2,2'-azotertbutane (($CH_3$)$_6C_2N_2$), organic or alkyl azides, such as methylazide ($CH_3N_3$), ethylazide ($C_2H_5N_3$), trimethylsilylazide ($Me_3SiN_3$), and other suitable nitrogen sources. Radical nitrogen compounds can be produced by heat, hot-wires and/or plasma, such as $N_3$, $N_2$, $N$, $NH$, or $NH_2$. In many examples, the nitrogen-containing gas contains ammonia. The nitrogen-containing gas may have a flow rate within a range from about 50 sccm to about 2,000 sccm, preferably, from about 100 sccm to about 1,500 sccm. In various examples, the nitrogen-containing gas may have a flow rate of about 100 sccm, 500 sccm, 1,000 sccm or 1,500 sccm.

In one embodiment, the at least one hydrogen precursor gas is provided by hydrogen gas ($H_2$). Other reactive hydrogen generating gas source like Hydrazine ($N_2H_4$, a liquid) can also be used as precursor. The hydrogen precursor gas is introduced to the process chamber 15 at a rate higher than previously considered when the objective is to reduce hydrogen incorporation into the silicon containing deposited layer. Without wishing to be bound, but in the interest of further disclosing some aspects of some embodiments of the present disclosure, the increased hydrogen can act as an etchant, e.g., an in situ etchant for removing weakly bonded $CH_x$, and $NH_y$ groups during the deposition process. During the plasma deposition process, weakly bounded (bonded) $CH_x$, and $NH_y$, even groups of $SiH_z$, (where x, y, z>=1) in the film react with reactive Hydrogen to form volatile species, such as $CH_4$, and $NH_3$ and/or $SiH_4$, and remove subsequently from film. As the consequence, the addition of hydrogen as a precursor gas during the deposition step can actually enhance the removal of the silicon to hydrogen (Si—H), nitrogen to hydrogen (N—H), carbon to hydrogen (C—H) bonding species, and enhance the strong and stable silicon to nitrogen (Si—N) by optimizing the chemical deposition and etch processes that occur during the formation of the low hydrogen (H) silicon including dielectric, e.g., low hydrogen (H) SiCNH. Some examples of other possible reaction pathways to reduce H and increase Si—N, Si—C and Si—$CH_2$—Si (increase Si—C) bonding, as well as remove weak C—$H_3$ and/or C—$H_2$ include:

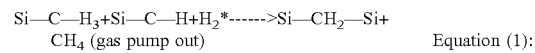

$$\text{Si—C—}H_3+\text{Si—C—H}+H_2^* \longrightarrow \text{Si—CH}_2\text{—Si}+ \\ CH_4 \text{ (gas pump out)} \qquad \text{Equation (1):}$$

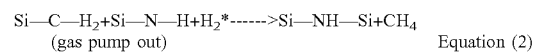

$$\text{Si—C—}H_2+\text{Si—N—H}+H_2^* \longrightarrow \text{Si—NH—Si}+CH_4 \\ \text{(gas pump out)} \qquad \text{Equation (2)}$$

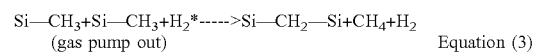

$$\text{Si—CH}_3+\text{Si—CH}_3+H_2^* \longrightarrow \text{Si—CH}_2\text{—Si}+CH_4+H_2 \\ \text{(gas pump out)} \qquad \text{Equation (3)}$$

Potential reaction reactions include:

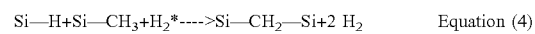

$$\text{Si—H}+\text{Si—CH}_3+H_2^* \longrightarrow \text{Si—CH}_2\text{—Si}+2\ H_2 \qquad \text{Equation (4)}$$

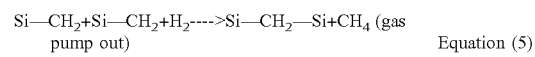

$$\text{Si—CH}_2+\text{Si—CH}_2+H_2 \longrightarrow \text{Si—CH}_2\text{—Si}+CH_4 \text{ (gas pump out)} \qquad \text{Equation (5)}$$

Reaction pathways to increase Si—N—Si include"

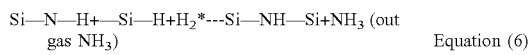

$$\text{Si—N—H+Si—CH}_2\text{+H}_2\text{*}\text{---->Si—NH—Si+CH}_4 \text{ (pump out)} \quad \text{Equation (7)}$$

In some embodiments, the low hydrogen silicon including dielectric, e.g., low hydrogen silicon carbon hydrogen and nitrogen, provides improved performance, which allows for optimized wet etching and reactive ion etching performance for etch selectivity with respect to liners, cap structures and other applications. The reduced hydrogen incorporation in the deposited silicon containing dielectric, e.g., low hydrogen (H) SiCNH, also provides for improved metal insulator semiconductor (MIS) electrical properties with respect to the SiCNH dielectric and other similar dielectrics. The removal of weak bonding of Si—H, C—H or N—H, and the increase of stronger Si—C, Si—N bond's density in the lower hydrogen SiCNH film, improves the film's strong bond's density, and improves the MIS electrical of the film including the Electrical breakdown and leakage performance. The reduced hydrogen incorporation in the deposited silicon containing dielectric, e.g., low hydrogen (H) SiCNH, further provides that the material is optimized as an oxidation barrier, and as a barrier to copper (Cu) diffusion at reduced thicknesses. This provides that the disclosed dielectric materials and deposition processes are suitable for optimizing the silicon, nitrogen and oxygen content of low hydrogen SiCNH compositions and conformally step coverage in applications that are sub 10 nm for back end of the line and/or front end of the line microelectronic and nanoelectronic manufacturing applications.

In some embodiments, to provide for low-hydrogen silicon including dielectrics the hydrogen precursor is introduced to the process chamber 15 during the deposition step at a rate of 500 sccm or greater. For example, the hydrogen precursor gas may be introduced to the deposition chamber 15 at a rate of 50, sccm 500 sccm, 1000 sccm, 1500 sccm, 2000 sccm, 2500 sccm, 3000 sccm, 3500 sccm, 4000 sccm, 4500 sccm and 5000 sccm, as well as any range including one of the aforementioned values as a maximum value for the range and a minimum value for the range. For example, the rate for introducing the hydrogen precursor gas to the process chamber during the formation of the low hydrogen silicon including dielectric may range from 500 sccm to 5000 sccm as the preferable range. In another example, the rate for introducing the hydrogen precursor gas to the process chamber during the formation of the low hydrogen silicon including dielectric may range from 1000 sccm to 4500 sccm. In yet another example, the rate for introducing the hydrogen precursor gas to the process chamber during the formation of the low hydrogen silicon including dielectric may range from 2000 sccm to 400 sccm. It is noted that the flow rate for the hydrogen precursor gas that is being introduced to the process chamber 15 may be any value that is within the aforementioned ranges and between the aforementioned examples. Although, the hydrogen precursor gas is referred to herein in one example as $H_2$ gas, it is noted that it is not intended that the hydrogen precursor gas be limited to only this example, as other gasses including hydrogen in their majority have also been considered, as well as gasses having lesser amounts of hydrogen. The molar ratio for Hydrogen/Silicon base precursor should be equal or greater than 0.05.

In addition to the hydrogen precursor gas and the at least one dielectric providing gas species the precursor gasses may be accompanied with a carrier gas. For example, He, $N_2$, and Ar may be used as carrier gases. Ar, Xe, and He may also help activate the precursor molecules and enable lower power deposition, which may be desirable if there are materials on the substrate sensitive to high bombardment i.e. high plasma power.

In one example, the precursor gases may include at least one dielectric providing gas species of trimethyl silane (TMS), and ammonia ($NH_3$) with a hydrogen precursor gas composed of hydrogen gas ($H_2$) with a carrier gas of argon (Ar), wherien the deposition temperature was on the order of 350° C. and the flow rate for the hydrogen gas ($H_2$) ranges from 1000 sccm to 4000 sccm.

Referring to FIG. 1, in some embodiments, forming the low hydrogen (H) silicon including dielectric. e.g., low hydrogen (H) SiCNH dielectric, includes activating the precursor gas compounds by preferentially breaking one or more of the labile bonds in the precursor gas compound using a plasma. The precursor gas compounds are controllably activated so that the bonds within the compound are not completely broken. As one or more of the labile bonds are preferentially broken, only a few reaction sites are formed, such as a single site, along the long chain radicals created during activation of the precursor compounds, such as if a hydrocarbon group left the compound. The precursor compound is therefore mostly inactive, and can react on a surface of the substrate 10 only at a specific location along the compound. It is believed that this provides more mobility to the precursor compound to move along the surface of the substrate until it finds a location along the surface with which it can react. A precursor material layer is formed on the substrate wherein the precursor gas compound bonds and/or reacts with a surface on the substrate at the reaction site.

In some embodiments of the present disclosure, PECVD techniques promote excitation and/or disassociation of the reactant gases by the application of the electric field to the reaction zone near the substrate surface, creating a plasma 60 of reactive species. The reactivity of the species in the plasma 60 reduces the energy required for a chemical reaction to take place, in effect lowering the required temperature for such PECVD processes.

Next in the deposition cycle, a plasma treatment process is performed on the precursor material layer to form a conformal silicon nitride layer. The plasma treatment process includes flowing a plasma treatment gas into the processing chamber. The precursor gas flow may be shut off during the plasma treatment process and any of the other gases in the processing gas mixture may continue to flow, or stopped and other plasma treatment gases used. Under these plasma conditions, it is believed that the precursor layer on the surface of the substrate is cross-linked in certain configurations and numbers to form a Si—N—Si network, thereby forming a conformal silicon nitride film. It is believed that the plasma treatment reacts with N—H bonds on the surface and prepares the surface for the next layer of precursor material.

In some embodiments, plasma treatment gases may include some of the same gases that are already present in the processing gas mixture. In some embodiments, the plasma treatment gas may include ammonia ($NH_3$), hydrazine ($N_2H_4$), helium (He), argon (Ar), nitrogen ($N_2$), Xenon (Xe), and combinations thereof. The type of plasma treatment gas or gasses and the plasma treatment processing conditions are modified to achieve desired film properties in the conformal silicon nitride layer. Ar, Xe, and He may be used as diluents in the plasma to help control plasma density.

Referring to FIG. 2, the showerhead 25 and substrate support pedestal 35 may also form a pair of spaced electrodes. When an electric field is generated between these electrodes, the process gases introduced into chamber 15 are ignited into a plasma 60. Typically, the electric field is generated by connecting the substrate support pedestal 35 to a source of single-frequency or dual-frequency radio frequency (RF) power (not shown) through a matching network (not shown). Alternatively, the RF power source and matching network may be coupled to the showerhead 25, or coupled to both the showerhead 25 and the substrate support pedestal 35.

Activation of the compound may occur by generating a plasma in the processing chamber at an RF power density from about 0.01 W/cm$^2$ to as high at about 10.0 W/cm$^2$. In one embodiment, the RF power density may range from about 0.1 W/cm$^2$ to about 1.0 W/cm$^2$. The degree to which the precursor compounds are activated may be adjusted by the power density so that only a few, and in some cases a single, active site is formed along the precursor compound.

As noted above, the control unit 30 is responsible for automated control of the numerous steps required for substrate processing, such as substrate transport, gas flow control, liquid flow control, temperature control, chamber evacuation, and so on. When the process gas mixture exits the showerhead 25, plasma enhanced activation of the precursor gas occurs, resulting in the deposition of a precursor on the surface of substrate 10.

In some embodiments, the above described method produces a low hydrogen (H) silicon containing dielectric material layer. The low hydrogen (H) silicon containing dielectric material layer may have any thickness. In some embodiments, the thickness of the low hydrogen (H) silicon containing dielectric material is less than 20 nm. For example, the thickness of the low hydrogen (H) silicon containing dielectric material may be less than 15 nm. In some embodiments, the thickness of the low hydrogen (H) silicon containing dielectric material may range from 1 nm to 15 nm. In some other embodiments, the thickness of the low hydrogen (H) silicon containing dielectric material may range from 5 nm to 10 nm.

In some embodiments, the hydrogen content of the low hydrogen (H) silicon containing dielectric material layer may be no greater than 30 at. %. In some embodiments, a low hydrogen (H) SiCNH dielectric may be composed of 25 at. % to 35 at. % silicon (Si), 10 at. % to 25 at. % nitrogen (N), 15 at. % to 25 at. % carbon (C), 20 at. % to 30 at. % hydrogen; with a N/Si ratio ranging from 0.7 to 0.8, a C/Si ratio ranging from 0.6% to 0.7%. H/Si ratio ranging from 0.9 to 1.1, a H/N ratio ranging from 1.3 to 1.4, and a H/C ratio ranging from 1.4 to 1.5. In one example, the low hydrogen (H) SiCNH dielectric may be composed of 29.3 at. % silicon (Si), 21.7 at. % nitrogen (N), 20.1 at. % carbon (C), 28.9% hydrogen; with a N/Si ratio of 0.74, a C/Si ratio of 0.69%, H/Si ratio of 0.99, a H/N ratio of 1.33, and a H/C ratio of 1.44.

In some embodiments, when the aforementioned low hydrogen SiCNH layer when treated with an ultraviolet curing process for a temperature ranging from 350° C. to 400° C. for a time period ranging from 500 seconds to 600 seconds has a shrinkage that is less than 4.5%. In some examples, treating the above described low hydrogen SiCNH layer with an ultraviolet curing process for a temperature ranging from 350° C. to 400° C. for a time period ranging from 500 seconds to 600 seconds produces a shrinkage in the low hydrogen SiCNH layer that ranges from 1% to 3%.

The above described deposition process including the hydrogen precursors can produce a low hydrogen silicon containing layer having a higher density than prior methods. For example, the low hydrogen SiCNH provided by the methods disclosed herein has a density greater than 2.00 grm/cm$^3$. In another example, the low hydrogen SiCNH provided by the methods disclosed herein has a density greater than 2.25 grm/cm$^3$. For example, when the at least one hydrogen gas precursor is added to the deposition process in an amount ranging from 1000 sccm to 4500 sccm in accordance with the method described with reference to FIG. 1, the deposited low hydrogen SiCNH layer may have a density ranging from 2.25 grm/cm$^3$ to 2.5 grm/cm$^3$.

The low hydrogen SiCNH layer provided herein is suitable for robust ultrathin (1-20 nm) low H SiCNH dielectric films with applications as spacer, cap structures, liner layers, oxidation barriers, passivation barriers, as well as etch stop layer in nano-devices both for FEOL and BEOL Cu interconnect structure. In some embodiments, the low hydrogen SiCNH layer provided herein is especially suitable for semiconductor devices having dimensions of 10 nm or less.

The following examples are provided to further illustrate the present invention and demonstrate some advantages that arise therefrom. It is not intended that the invention be limited to the specific examples disclosed.

EXAMPLES

Plasma enhanced chemical vapor deposition (PECVD) is used for depositing low temperature (350 C) dielectric barrier cap SiCNH and low Hydrogen SiCN films on 300 mm Blanket Si, Blanket Cu on Si for evaluation. Plasma volatilizes the precursor enabling precursor cracking without exceeding the BEOL temperature constraint. Prior to deposition of dielectric cap film, an NH$_3$ plasma pre-clean was performed followed by PECVD SiNH cap film deposition, which was implemented sequentially in a commercial 300 mm system. SiNC and low Hydrogen SiCN film were deposited using Trimethyl-Silane and ammonia as precursors for SiCNH and Trimethyl-Silane, ammonia and Hydrogen as precursors for SiCNH at 350° C. using a 13.56 MHz RF power supply. The only difference between the SiCN and low hydrogen SiCN film's deposition process was the insertion of additional hydrogen gases, i.e., hydrogen gas precursor.

Figure 3:
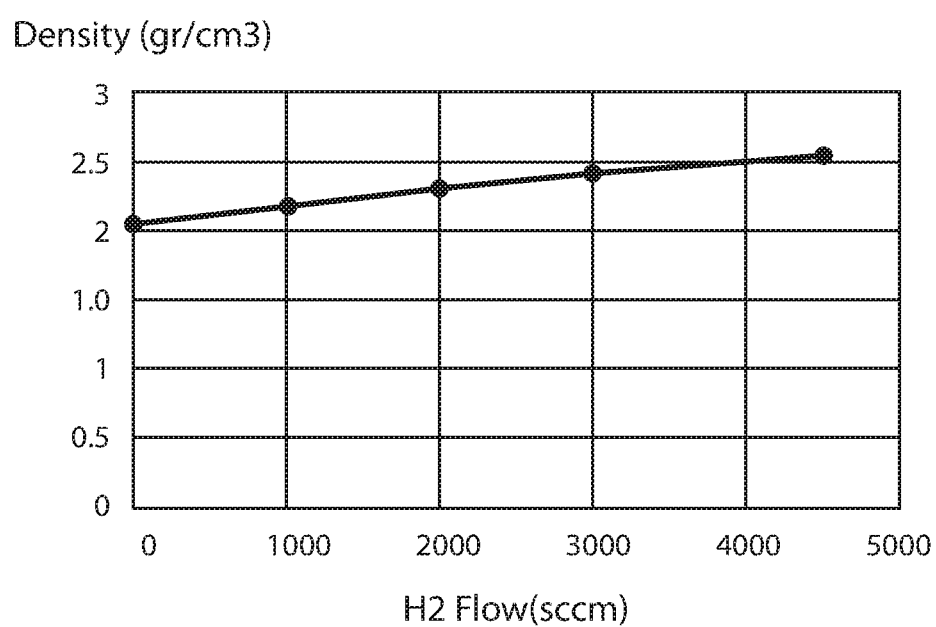
FIG. 3 is a plot illustrating how the density of a low hydrogen SiCNH layer increases with increasing flow rate for the hydrogen gas precursor, in accordance with some embodiments of the present disclosure.
Figure 4:
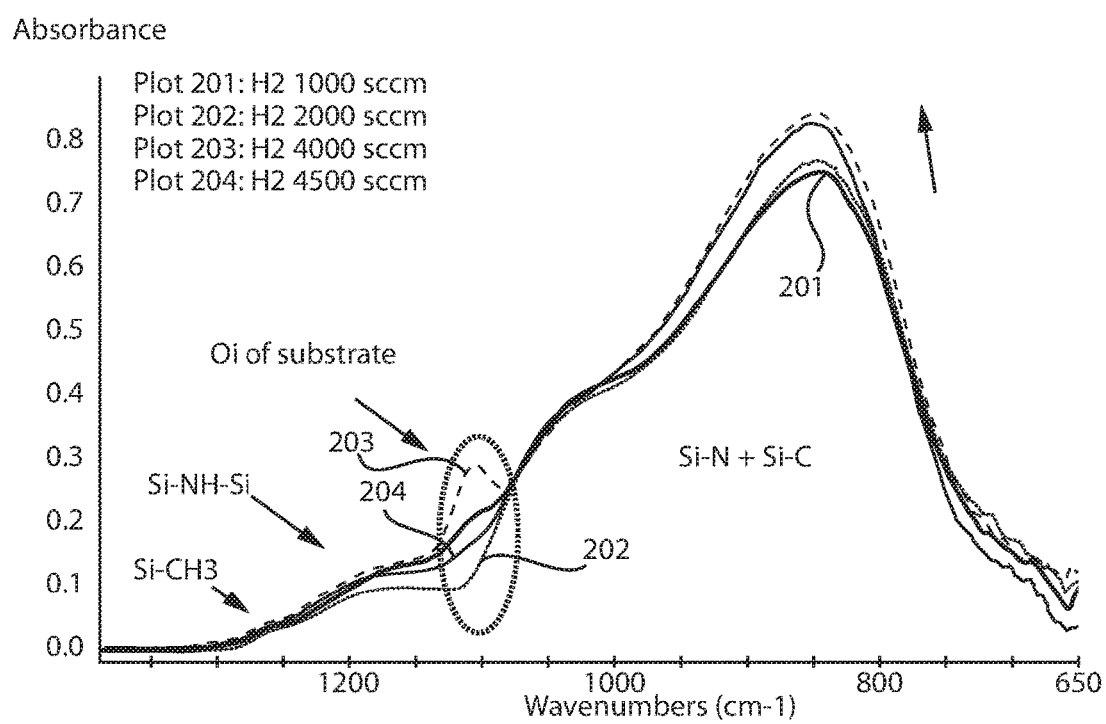
FIG. 4 is a plot illustrating FTIR analysis for low hydrogen SiCNH layers, in which the hydrogen precursor gas rate is increased within the range of 1000 sccm to 4500 sccm, in accordance with some embodiments of the present disclosure.

Fourier Transform Infrared (FTIR) Analysis, Rutherford Backscattering data, X-Ray Photoelectron Spectroscopy and hydrogen forward scattering film's analysis measured that the film deposit with the additional hydrogen precursors have about 25% high in film's density, are about 5 atomic percent lower in hydrogen concentration and have significantly more Si—N, Si—C and Si—CH2-Si bonding in the film. FIG. 3 is a plot illustrating how the density of a SiCNH layer increases with increasing flow rate for the hydrogen gas precursor. FIG. 4 is a plot illustrating some of the results of the FTIR analysis indicating that as the hydrogen precursor gas rate is increased within the range of 1000 sccm to 4500 sccm, the Si—N, Si—C bonding increases in a low hydrogen SiCNH film. Referring to FIG. 4, plot 201 is for a low hydrogen SiCNH layer deposited with a hydrogen gas precursor rate of 1000 sccm; plot 202 is for a low hydrogen SiCNH layer deposited with a hydrogen gas precursor rate of 2000 sccm, plot 203 is for a low hydrogen SiCNH layer deposited with a hydrogen gas precursor rate of 4000 sccm; and plot 204 is for a low hydrogen SiCNH layer deposited with a hydrogen gas precursor rate of 4500 sccm.

Figure 5:
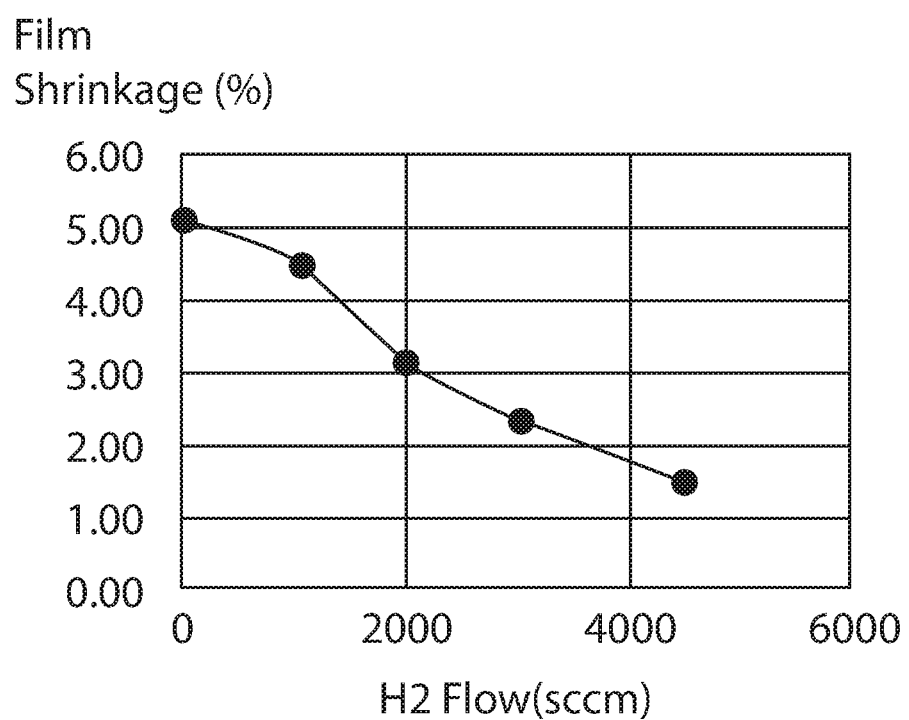
FIG. 5 is a plot of low hydrogen SiCNH film shrinkage after UV irradiation as a function of hydrogen gas precursor rate, in accordance with some embodiments of the present disclosure.
Figure 6:
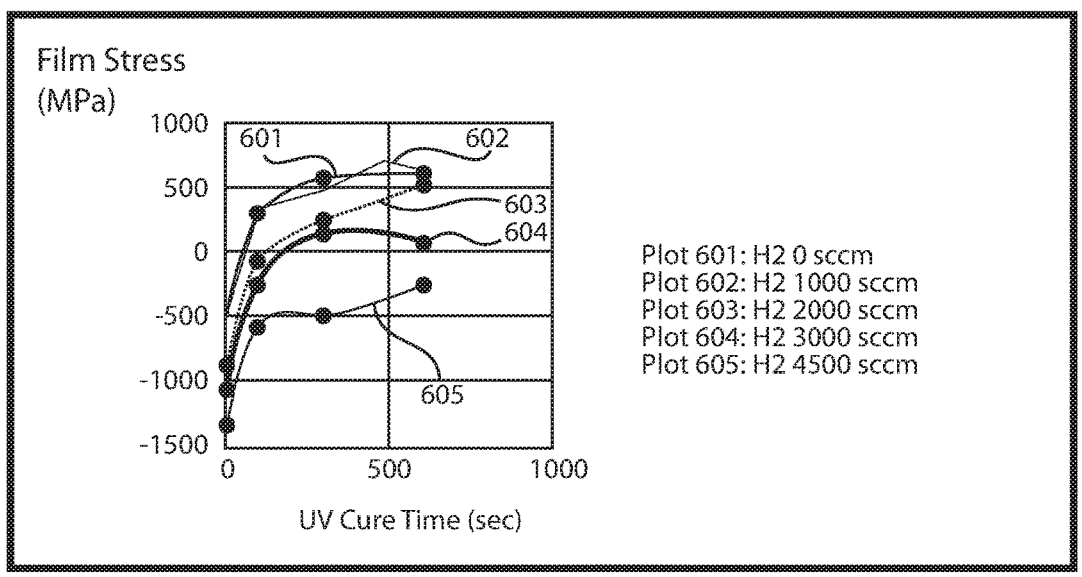
FIG. 6 is a plot of compressive stress that is measured from a low-hydrogen SiCNH film as a function of hydrogen gas precursor rate, in accordance with some embodiments of the present disclosure.

The low hydrogen SiCN film's shrinkage is consistently lower than the standard SiCN and retain compressive film's stress film under UV irradiation. FIG. 5 illustrates a plot of film shrinkage after UV irradiation as a function of hydrogen gas precursor rate. As the hydrogen gas precursor rate increases, the film shrinkage decreases. The UV irradiation applied to the low hydrogen SiCNH film that provided the data in FIG. 5 was a UV cure for 600 second at 385° C. The data plotted in FIG. 5 suggested that less hydrogen is present in SiCN films formed using the hydrogen gas precursor methods than prior methods that do not include the hydrogen gas flow rates disclosed herein. FIG. 6 is a plot of compressive stress that is measured from a low-hydrogen SiCNH film as a function of hydrogen gas precursor rate vs UV cure time. The compressive stress increase (more negative) as the hydrogen gas flow rates are increased from 0 sccm to 4500 sccm. The increase compressive stress is preferable as cap material for Cu low k interconnects. As the UV cure time of the deposited films increase to 600 seconds, the low H SiCN layer deposited with 4500 sccm hydrogen still retain compressive stresses, which can make it more preferable as a cap material for Cu-low k interconnects. Referring to FIG. 6, plot 601 is for a SiCN layer deposited without a hydrogen gas precursor; plot 602 is for a low hydrogen SiCNH layer deposited using a hydrogen gas precursor rate of 1000 sccm; plot 603 is for a low hydrogen SiCNH layer deposited using a hydrogen gas precursor rate of 2000 sccm, plot 604 is for a low hydrogen SiCNH layer deposited using a hydrogen gas precursor rate of 3000 sccm; and plot 605 is for a low hydrogen SiCNH layer deposited using a hydrogen gas precursor rate of 4500 sccm.

Typical Auger compositional depth profile of low hydrogen SiCN vs standard SiCN (deposited with hydrogen precursor) show similar film's composition except the amount of hydrogen in the film. The silicon, carbon and nitrogen composition is generally uniform with depth thickness except for minor variation at the interfaces. 100A thick low hydrogen SiCN deposited on plated Cu show no sign of oxidation after 310° C., and 24 hours of oxidation in air. Compared to standard SiCN cap film, overall lower hydrogen SiCN cap film has better oxidation barrier and MIS electrical properties even at sub-10 nm thickness.

With aluminum MIS dots, the electrical breakdowns and leakages of ultrathin 7-9 nm low hydrogen SiCN film is generally better than the standard thicker 150A SiCNH cap film.

Having described preferred embodiments of a robust high performance low hydrogen silicon carbon nitride (SiCNH) dielectric for nano electronic devices, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for depositing a dielectric layer of SiCNH comprising:
   introducing a substrate into a process chamber of a deposition tool;
   heating the substrate to a process temperature;
   introducing precursors that include at least one dielectric providing gas species for a deposited layer of SiCNH and at least one hydrogen precursor gas of $H_2$ into the process chamber of the deposition tool, wherein the hydrogen precursor gas is introduced to the process chamber at a flow rate ranging from 50 sccm to 5000 sccm; and
   activating a plasma in the process chamber, wherein deposited SiCNH has a shrinkage that is less than 4.5% after being treated with an ultraviolet curing process for a temperature ranging from 350° C. to 400° C. for a time period ranging from 500 seconds to 600 seconds.

2. The method of claim 1, wherein the deposition tool comprises a plasma enhanced chemical vapor deposition chamber or a high density plasma chemical vapor deposition (HDP) chamber.

3. The method of claim 1, wherein the at least one dielectric providing gas species for the deposited layer comprises at least one of a silicon containing precursor, a carbon containing precursor and a nitrogen containing precursor.

4. The method of claim 3, wherein the silicon containing precursor comprises hexachlorodisilane ($Si_2Cl_6$), tetrachlorosilane ($SiCl_4$), dichlorosilane ($Cl_2SiH_2$), trichlorosilane ($Cl_3SiH$), methylsilane (($CH_3)SiH_3$), dimethylsilane (($CH_3)_2 SiH_2$), trimethyl silane (($CH_3)_3SiH$), tetramethyl silane (($CH_3)_4Si$), ethylsilane (($CH_3CH_2)SiH_3$), methyldisilane (($CH_3)Si_2H_5$), dimethyldisilane (($CH_3)_2Si_2H_4$), hexamethyldisilane (($CH_3)_6Si_2$) or combinations thereof.

5. The method of claim 1, wherein the carbon containing precursor comprises methylsilane ($CH_3SiH_3$), dimethylsilane (($CH_3)_2SiH_2$), trimethyl silane (($CH_3)_3SiH$), tetramethyl silane (($CH_3)_4Si$), ethylsilane ($CH_3CH_2SiH_3$), methane ($CH_4$), ethylene ($C_2H_4$), ethyne ($C_2H_2$), propane ($C_3H_8$), propene ($C_3H_6$), butyne ($C_4H_6$) or combinations thereof.

6. The method of claim 1, wherein the nitrogen containing precursor comprises ammonia ($NH_3$), hydrazine ($N_2H_4$), methyl hydrazine (($CH_3)HN_2H_2$), dimethyl hydrazine (($CH_3)_2N_2H_2$), t-butylhydrazine ($C_4H_9N_2H_3$), phenylhydrazine ($C_6H_5N_2H_3$), $N_2$, $N_2/H_2$, $NH_3$, $N_2H_4$ plasmas, 2,2'-azotertbutane (($CH_3)_6C_2N_2$), methylazide ($CH_3N_3$), ethylazide ($C_2H_5N_3$), trimethylsilylazide ($Me_3SiN_3$), and combinations thereof.

7. The method of claim 1, wherein the at least one dielectric providing gas species for the deposited layer is introduced to the process chamber at a flow rate ranging from 50 sccm to about 2,000 sccm.

8. The method of claim 1, wherein the shrinkage ranges from 1% to 3%.

9. The method of claim 1, wherein the SiCNH has a density greater than 2.25 grm/$cm^3$.

* * * * *